(12) United States Patent
Moriizumi

(10) Patent No.: US 8,514,955 B2
(45) Date of Patent: Aug. 20, 2013

(54) COMMUNICATION SYSTEM, DATA TRANSMITTER, AND DATA RECEIVER CAPABLE OF DETECTING INCORRECT RECEIPT OF DATA

(75) Inventor: Ryuichi Moriizumi, Mihama-ku (JP)

(73) Assignee: MegaChips Corporation, Osaka-shi (JP)

( * ) Notice: Subject to any disclaimer, the term of this patent is extended or adjusted under 35 U.S.C. 154(b) by 433 days.

(21) Appl. No.: 12/659,408

(22) Filed: Mar. 8, 2010

(65) Prior Publication Data
US 2010/0246699 A1 Sep. 30, 2010

(30) Foreign Application Priority Data

Mar. 24, 2009 (JP) ................................. 2009-72093

(51) Int. Cl.
*H04L 27/28* (2006.01)
(52) U.S. Cl.
USPC ........... 375/260; 375/316; 375/346; 375/348; 714/762; 714/701; 714/746
(58) Field of Classification Search
USPC ......... 375/224, 260, 316, 346, 348; 714/762, 714/701, 746
See application file for complete search history.

(56) References Cited

U.S. PATENT DOCUMENTS

| | | | | |
|---|---|---|---|---|
| 4,586,159 A * | 4/1986 | Thomas et al. | ................ | 703/27 |
| 6,862,296 B1 * | 3/2005 | Desai | ............................ | 370/503 |
| 7,853,849 B2 * | 12/2010 | Kurayama | .................... | 714/738 |
| 2005/0071729 A1 * | 3/2005 | Kim | ............................. | 714/755 |
| 2006/0107171 A1 * | 5/2006 | Skraparlis | ..................... | 714/752 |
| 2007/0230594 A1 * | 10/2007 | Mo et al. | ....................... | 375/260 |
| 2008/0114562 A1 | 5/2008 | Sul et al. | | |
| 2008/0240212 A1 | 10/2008 | Satou | | |

FOREIGN PATENT DOCUMENTS

| | | |
|---|---|---|
| JP | A-2001-175170 | 6/2001 |
| JP | A-2008-193516 | 8/2008 |

* cited by examiner

*Primary Examiner* — Leila Malek
(74) *Attorney, Agent, or Firm* — Oblon, Spivak, McClelland, Maier & Neustadt, L.L.P.

(57) ABSTRACT

A transmitter cyclic pattern having a pattern length of N bits is generated and converted into an M-bit transmitter parallel data stream, where $N \neq M$. A bit-sequence altered transmitter parallel data stream is generated by performing a transmitter altering process, converted into a serial data and transmitted together with a clock signal. The serial data is received and converted into an M-bit receiver parallel data stream, and a bit-sequence restored parallel data stream is generated by performing a process opposite to the transmitter altering process. A receiver cyclic pattern is generated by using bits in the bit-sequence restored parallel data stream and converted into an M-bit reference parallel data stream, and a bit-sequence altered reference parallel data stream is generated by performing a process same as the transmitter altering process and compared with the received parallel data to test if the data is correctly received.

12 Claims, 9 Drawing Sheets

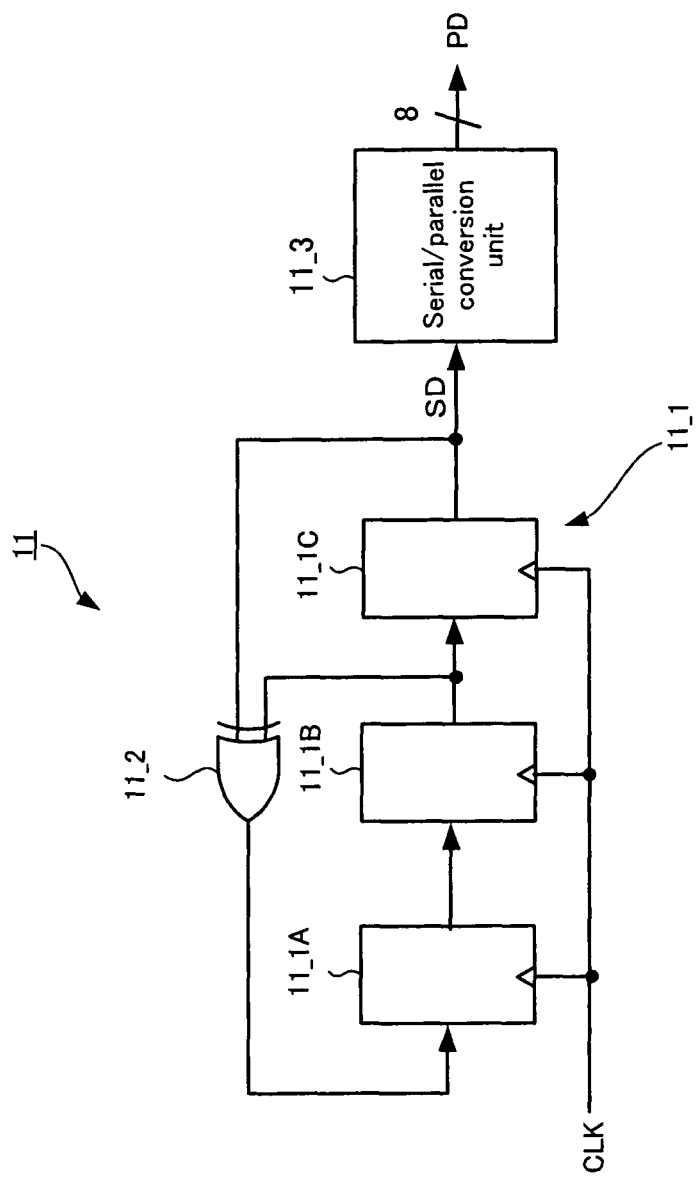

FIG. 3A — 8-bit parallel data stream (PRBS pattern)

| | MSB | | | | | | | LSB |
|---|---|---|---|---|---|---|---|---|
| Row 1 | a | g | f | e | d | c | b | a |
| 2 | b | a | g | f | e | d | c | b |
| 3 | c | b | a | g | f | e | d | c |
| 4 | d | c | b | a | g | f | e | d |
| 5 | e | d | c | b | a | g | f | e |
| 6 | f | e | d | c | b | a | g | f |
| 7 | g | f | e | d | c | b | a | g |
| 8 | a | g | f | e | d | c | b | a |

FIG. 3B — Bit-sequence reversed parallel data stream

| | MSB | | | | | | | LSB |
|---|---|---|---|---|---|---|---|---|
| Row 1 | a | b | c | d | e | f | g | a |
| 2 | b | c | d | e | f | g | a | b |
| 3 | c | d | e | f | g | a | b | c |
| 4 | d | e | f | g | a | b | c | d |
| 5 | e | f | g | a | b | c | d | e |
| 6 | f | g | a | b | c | d | e | f |
| 7 | g | a | b | c | d | e | f | g |
| 8 | a | b | c | d | e | f | g | a |

FIG. 3C — Output of de-serializer 21 (with bit-shift)

| | MSB | | | | | | | LSB |
|---|---|---|---|---|---|---|---|---|
| Row 1 | b | c | d | e | f | g | a | g |
| 2 | c | d | e | f | g | a | b | a |
| 3 | d | e | f | g | a | b | c | b |
| 4 | e | f | g | a | b | c | d | c |
| 5 | f | g | a | b | c | d | e | d |
| 6 | g | a | b | c | d | e | f | e |
| 7 | a | b | c | d | e | f | g | f |
| 8 | b | c | d | e | f | g | a | g |

FIG. 3D — Output of bit-sequence reversing circuit 22 (with bit-shift)

| | MSB | | | | | | | LSB |
|---|---|---|---|---|---|---|---|---|
| Row 1 | g | a | g | f | e | d | c | b |
| 2 | a | b | a | g | f | e | d | c |
| 3 | b | c | b | a | g | f | e | d |
| 4 | c | d | c | b | a | g | f | e |
| 5 | d | e | d | c | b | a | g | f |
| 6 | e | f | e | d | c | b | a | g |
| 7 | f | g | f | e | d | c | b | a |
| 8 | g | a | g | f | e | d | c | b |

300

Related Art

FIG.9A

8-bit parallel data stream (PRBS pattern)

MSB → LSB

| Row | | | | | | | |
|---|---|---|---|---|---|---|---|
| 1 | a | g | f | e | d | c | b | a |
| 2 | b | a | g | f | e | d | c | b |
| 3 | c | b | a | g | f | e | d | c |
| 4 | d | c | b | a | g | f | e | d |
| 5 | e | d | c | b | a | g | f | e |
| 6 | f | e | d | c | b | a | g | f |
| 7 | g | f | e | d | c | b | a | g |
| 8 | a | g | f | e | d | c | b | a |

FIG.9B

Output of de-serializer 321 (with bit-shift)

MSB → LSB

| Row | | | | | | | |
|---|---|---|---|---|---|---|---|
| 1 | g | f | e | d | c | b | a | g |
| 2 | a | g | f | e | d | c | b | a |
| 3 | b | a | g | f | e | d | c | b |
| 4 | c | b | a | g | f | e | d | c |
| 5 | d | c | b | a | g | f | e | d |
| 6 | e | d | c | b | a | g | f | e |
| 7 | f | e | d | c | b | a | g | f |
| 8 | g | f | e | d | c | b | a | g |

FIG.9C

Output of PRBS pattern generation circuit 322 (with bit-shift)

MSB → LSB

| Row | | | | | | | |
|---|---|---|---|---|---|---|---|
| 1 | g | f | e | d | c | b | a | g |
| 2 | a | g | f | e | d | c | b | a |
| 3 | b | a | g | f | e | d | c | b |
| 4 | c | b | a | g | f | e | d | c |
| 5 | d | c | b | a | g | f | e | d |
| 6 | e | d | c | b | a | g | f | e |
| 7 | f | e | d | c | b | a | g | f |
| 8 | g | f | e | d | c | b | a | g |

COMMUNICATION SYSTEM, DATA TRANSMITTER, AND DATA RECEIVER CAPABLE OF DETECTING INCORRECT RECEIPT OF DATA

This application claims priority from Japanese Patent Application No. 2009-72093, filed on Mar. 24, 2009, which is hereby incorporated by reference in its entirety.

BACKGROUND

This disclosure relates to communication systems capable of performing tests using cyclic patterns that repeat fixed bit-sequences. This disclosure also relates to data transmitters and data receivers that are suitable to construct the data communication systems.

Pseudo random bit sequence patterns (PRBS patterns), standardized according to the recommendation by International Telecommunication Union, Telecommunication Standardization Sector (ITU-T), are widely utilized for testing communication systems.

FIG. 5 is a schematic drawing that shows an exemplary construction of a conventional communication system capable of performing a test using the PRBS pattern. The communication system 100 shown in FIG. 5 includes a data transmitter 110 and a data receiver 120.

The data transmitter 110 includes a PRBS pattern generating circuit 111 that generates an m-bit parallel PRBS pattern in synchronous with a clock signal CLK. The data transmitter 110 also includes a serializer 112 that converts the parallel PRBS pattern generated by the PRBS pattern generating circuit 111 into serial data SD.

The data receiver 120 includes a clock-data recovery circuit 121, which receives the serial data SD transmitted from the serializer 112, generates a clock signal in synchronous with the received serial data SD, acquire the serial data SD using the generated clock signal, and outputs m-bit parallel data. The data receiver 120 also includes a PRBS pattern generating circuit 122 that generates a PRBS pattern having the construction same as the construction of the PRBS pattern generating circuit 111 in the data transmitter 110. The PRBS pattern generating circuit 122 generates a reference PRBS pattern to be compared with the parallel data output from the clock-data recovery circuit 121.

The data receiver 120 further includes a comparing and checking circuit 123. The comparing and checking circuit 123 compares the parallel data output from the clock-data recovery circuit 121 and the reference PRBS pattern generated by the PRBS pattern generating circuit 122, and checks if the serial data SD transmitted from the transmitter 110 is correctly received by the data receiver 120.

In the communication system 100 thus constructed, a test for checking if the serial data SD transmitted from the data transmitter 110 is correctly received by the data receiver 120 may be performed in the following steps.

(Step 1) The data transmitter 110 converts, using the serializer 112, the parallel PRBS pattern generated by the PRBS pattern generation circuit 111 into serial data SD, and transmits the serial data SD to the data receiver 120.

(Step 2) The data receiver 120 receives the serial data SD transmitted from the data transmitter 120 using the clock-data recovery circuit 121. The clock-data recovery circuit 121 generates parallel data based on the received serial data SD and outputs the generated parallel data to the PRBS pattern generating circuit 122 and to the comparing and checking circuit 123. When the first m bits of the parallel data is input from the clock-data recovery circuit 121, the PRBS pattern generating circuit 122 starts generating reference PRBS pattern using the first m bits as initial values.

(Step 3) The comparing and checking circuit 123 compares the parallel data received from the clock-data recovery circuit 121 with the reference PRBS pattern received from the PRBS pattern generating circuit 122.

(Step 4) When the parallel data does not matches the reference PRBS pattern, the comparing and checking circuit 123 checks that the serial data SD transmitted from the data transmitter is not correctly received by the data receiver 120, and generates a bit-fault determination signal ERR. Thus, a test for checking if the serial data SD transmitted from the data transmitter 110 is correctly received by the data receiver 120 is performed.

US Patent Publications Nos. 2008/0114562 and 2008/0240212 disclose exemplary data communication apparatuses capable of performing the test described above.

FIG. 5 is a schematic drawing that shows an exemplary communication system that utilizes a first communication scheme between the data transmitter and the data receiver. In the first communication scheme, the data transmitter transmits serial data with the clock embedded therein and the data receiver recovers a clock signal in synchronous with the serial data. There is another communication scheme (a second communication scheme) where the serial data and the clock signal are transmitted through separate transmission lines.

FIG. 6 is a schematic drawing that shows an exemplary communication system that utilizes a second communication scheme. The data transmission system 200 shown in FIG. 6 may be used in, for example, a liquid-crystal display panel that includes a data transmitter 210 and a data receiver 220.

The data transmitter 210 includes a low voltage differential signal transmitter (LVDS-Tx) 211. Three sets of parallel data PD1, PD2, PD3, and a clock signal CLK are input to the LVDS-Tx 211. The LVDS-Tx 211 converts these parallel data PD1, PD2, and PD3 into serial data SD1, SD2, and SD3, which are synchronized with the clock signal CLK. The converted serial data SD1, SD2, and SD3 are transmitted to the data receiver 220 together with the clock signal.

The data receiver 220 includes a low voltage differential signal receiver (LVDS-Rx) 221. The serial data SD1, SD2, SD3 and the clock signal from the LVDS-Tx 211 are received by the LVDS-Rx 221. The LVDS-Rx 221 acquires the serial data SD1, SD2, and SD3 using the clock signal CLK, and converts these data into parallel data PD11, PD12, and PD13.

FIG. 7 shows an exemplary timing relationship between the serial data SD1 received by the data receiver 220, and the clock signal CLK. Timing relationships between the serial data SD2 and SD3 and the clock signal CLK are the same as the relationship between the serial data SD1 and the clock signal CLK.

FIG. 7 is a timing chart that shows an exemplary timing relationship between the serial data and the clock signal received by the data receiver shown in FIG. 6. FIG. 7 shows the serial data SD1 and the clock signal CLK received by the data receiver 220. FIG. 7 also shows the parallel data PD11 converted from the serial data acquired by the receiver 220. As shown in FIG. 7, the serial data SD1 may includes a bit stream including bits of . . . A[3], A[2], A[1], A[0], B[6], B[5], B[4], B[3], B[2], B[1], B[0], C[6], C[5], C[4], C[3], C[2], . . . .

The data receiver 220 successively acquires 7 bits in the serial data SD1 in synchronous with each rising edge of the clock signal CLK, and converts the acquired serial data into 7-bit parallel data PD11 in the order of the acquisition.

In the data receiver 220, the relationship between the data and the clock signal is determined in accordance with the application. For example, the data receiver 220 acquires seven consecutive bits of the serial data A[6], . . . , A[0] in synchronous with a clock signal having a rising edge between the bits A[2] and A[1] of the serial data. These bits are converted into 7-bit parallel data A[6:0], where the bit A[6] forms the most significant bit (MSB), and the bit A[0] forms the least significant bit (LSB) of the 7-bit parallel data, Similarly, the data receiver 220 acquires next seven consecutive bits of the serial data B[6], . . . , B[0] in synchronous with the clock signal having the next rising edge between the bits B[2] and B[1]. The data receiver 220 further acquires following bits of the serial data and converts into a stream of parallel data.

The previously described test using the PRBS pattern may also be performed in data communication systems according to the second communication scheme. FIG. 8 is a schematic drawing that shows an exemplary construction of a data communication system in accordance with the second communication scheme capable of performing a test using the PRBS pattern.

The exemplary data transmission system 300 shown in FIG. 8 includes a data transmitter 310 and a data receiver 320. The data receiver 320 may be a product to be tested, and the data transmitter 310 may be an apparatus for testing the data receiver 320. It is also possible to reverse the relationship between the product and the apparatus for testing.

The data transmitter 310 includes a PRBS pattern generating circuit 311 and a serializer 312. The PRBS pattern generating circuit 311 generates 8-bit parallel PRBS pattern in synchronous with a clock signal CLK. The PRBS pattern generating circuit 311 may generate 8-bit parallel PRBS pattern by dividing a cyclic pattern, which has 7 bits per cycle, at every 8 bits. The serializer 312 converts the 8-bit parallel PRBS pattern generated by the PRBS pattern generating circuit 311 into serial data SD in synchronous with the clock signal CLK and transmits to the data receiver together with the clock signal.

The data receiver 320 includes a de-serializer 321, a PRBS pattern generating circuit 322, and a comparing and checking circuit 323. The de-serializer 321 converts the serial data SD transmitted from the data transmitter 310 into 8-bit parallel data in synchronous with the clock signal CLK. That is, the data receiver 320 receives 8-bit parallel data by using the de-serializer 321. After receiving the first 8 bits of the parallel data (initial values) from the de-serializer 321, the PRBS pattern generating circuit 322 starts generating PRBS pattern that follows the initial values, which is used as a reference pattern.

The comparing and checking circuit 323 compares the parallel data output from the de-serializer 321 and the reference PRBS pattern generated by the PRBS pattern generating circuit 322. Thereby, the comparing and checking circuit 323 attempts to check whether the serial data SD transmitted from the data transmitter 310 is correctly received without any error by the data receiver 320.

However, this inventor discovered that the communication system 300 has a problem that it is difficult to detect incorrect receipt of the data due to a "bit-shift", which is a type of errors that might occur in the received parallel data stream.

SUMMARY

In order to address the above, an exemplary object of this disclosure is to provide data communication systems that can check whether the data transmitted from the data transmitter is correctly received by the data receiver. Another exemplary object of this disclosure is to provide data transmitters and data receivers that are capable to construct the data communication systems that can check whether the data is correctly received.

Various exemplary embodiments provide communication systems that include a data transmitter and a data receiver.

The data transmitter includes a transmitter cyclic pattern generating circuit, a transmitter bit-sequence altering circuit, and a serializer. The transmitter cyclic pattern generating circuit generates a transmitter cyclic pattern having a pattern length of N bits and converts the transmitter cyclic pattern into an M-bit transmitter parallel data stream. Each of N and M is an integer larger than one and N and M are different with each other. The transmitter bit-sequence altering circuit alters a sequence of bits in each word of the transmitter parallel data stream by performing a transmitter altering process including replacing specified ones of the bits in each word of the transmitter parallel data stream with each other so that a bit-sequence altered transmitter parallel data stream is generated. The serializer converts the bit-sequence altered transmitter parallel data stream into a serial data in synchronous with a clock signal and transmits the serial data together with the clock signal.

The data receiver includes a de-serializer, a receiver bit-sequence altering circuit, a receiver cyclic pattern generating circuit, an optional second bit-sequence altering circuit, and a comparing and checking circuit. The de-serializer receives the serial data and the clock signal, and coverts the serial data into an M-bit receiver parallel data stream in synchronous with the clock signal. The receiver bit-sequence altering circuit alters a sequence of bits in each word of the receiver parallel data stream by performing a receiver altering process opposite to the transmitter altering process so that a bit-sequence restored parallel data stream is generated. The receiver cyclic pattern generating circuit has the same construction as the transmitter cyclic pattern generating circuit. The receiver cyclic pattern generating circuit generates a reference cyclic pattern by using bits in the bit-sequence restored parallel data stream as initial values and coverts the reference cyclic pattern into an M-bit reference parallel data stream. The optional second bit-sequence altering circuit alters a sequence of bits in each word of the reference parallel data stream by performing a second altering process same as the transmitter altering process so that a bit-sequence altered reference parallel data stream is generated. The comparing and checking circuit compares one of (i) the receiver parallel data stream with the bit-sequence altered reference parallel data streams, and (ii) the bit-sequence restored parallel data stream with the reference parallel data stream.

According to various exemplary embodiments, the receiver cyclic pattern generating circuit may generate the reference cyclic pattern by using bits in a first word of the bit-sequence restored parallel data stream.

According to various exemplary embodiments, the serial data may have a cyclic pattern having an altered pattern length different from N bits. According to various exemplary embodiments, the serial data may have a cyclic pattern having an altered pattern length of N×M bits.

According to various other exemplary embodiments, the specified ones of the bits may include at least one of a most significant bit and a least significant bit. According to various other exemplary embodiments, the transmitter altering process may include reversing the bit sequence from a most significant bit to a least significant bit in each word.

Various exemplary embodiments provide data receivers that include a de-serializer, a receiver bit-sequence altering circuit, a receiver cyclic pattern generating circuit, an optional second bit-sequence altering circuit, and a comparing and checking circuit. The de-serializer receives a serial data and a clock signal and converts the serial data into an M-bit receiver parallel data stream in synchronous with the clock signal. The receiver bit-sequence altering circuit alters a sequence of bits in each word of the receiver parallel data stream by performing a first altering process including replacing specified ones of the bits in each word of the receiver parallel data stream with each other so that a bit-sequence restored parallel data stream is generated. The receiver cyclic pattern generating circuit generates a reference cyclic pattern having a pattern length of N bits by using bits in the bit-sequence restored parallel data stream as initial values. The receiver cyclic pattern generating circuit further converts the receiver cyclic pattern into an M-bit reference parallel data stream. The optional second bit-sequence altering circuit alters a sequence of bits in each word of the reference parallel data stream by performing a second altering process opposite to the first altering process so that a bit-sequence altered reference parallel data stream is generated. The comparing and checking circuit compares one of (i) the receiver parallel data stream with the bit-sequence altered reference parallel data stream, and (ii) the bit-sequence restored parallel data stream with the reference parallel data stream.

Various exemplary embodiments provide data transmitters that include a transmitter cyclic pattern generating circuit, a transmitter bit-sequence altering circuit, and a serializer.

BRIEF DESCRIPTION OF DRAWINGS

Various exemplary details of communication systems, data transmitters, and data receivers are described with reference to the following figures, wherein:

FIG. 2 is a schematic drawing that shows a construction of an exemplary PRBS pattern generating circuit shown in FIG. 1;

FIG. 3A is a table that shows an exemplary parallel PRBS pattern generated by the PRBS pattern generating circuit 11 shown in FIG. 1;

FIG. 3B is a table that shows an exemplary bit-sequence reversed parallel data stream generated by the parallel data bit-sequence reversing circuit 12 shown in FIG. 1;

FIG. 3C is a table that shows an exemplary parallel data stream output from the de-serializer 21 shown in FIG. 1 when a bit-shift occurs;

FIG. 3D is a table that shows an exemplary parallel data stream generated by the parallel data bit-sequence reversing circuit 22 shown in FIG. 1 when a bit-shift occurs;

FIG. 9A is a table that shows an exemplary parallel PRBS pattern generated by the PRBS pattern generating circuit in the data transmitter shown in FIG. 8;

FIG. 9B is a table that shows an exemplary pattern of the parallel data received by the data receiver shown in FIG. 1 when a bit-shift occurs; and FIG. 9C is a table that shows an exemplary parallel PRBS pattern generated by the PRBS pattern generating circuit when the bit-shift occurs.

DETAILED DESCRIPTION OF EMBODIMENTS

Exemplary embodiments of communication systems, data transmitters, and data receivers are described with reference to following figures.

Figure 8:
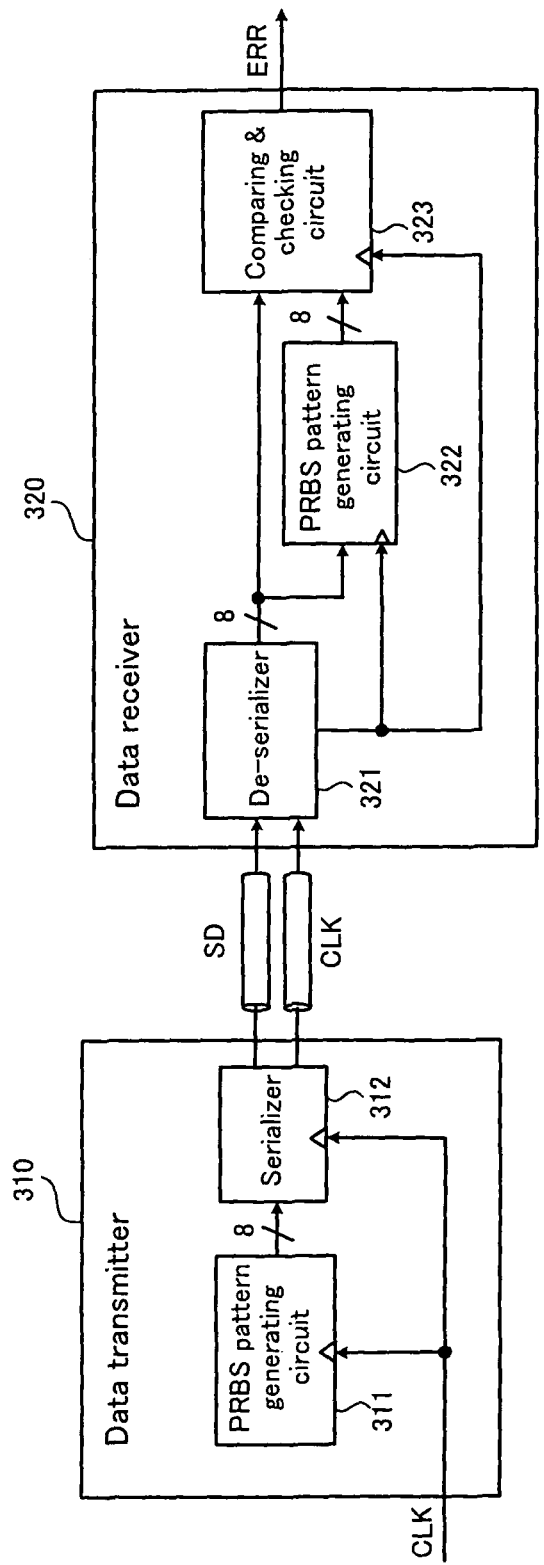
FIG. 8 is a schematic drawing that shows a construction of an exemplary communication system according to a second communication scheme capable of performing a test using PRBS pattern.

Firstly, it is examined if the communication system 300 shown in FIG. 8 can detect incorrect receipt of data due to the bit-shift.

FIG. 9 shows exemplary parallel data streams for explaining the bit-shift. FIG. 9A shows an exemplary 8-bit parallel data stream generated in the data transmitter 310, which may be a correct PRBS pattern for testing. The exemplary 8-bit parallel data is generated by dividing the serial PRBS pattern at every 8 bits. Each of the rows of FIG. 9A shows each of the words that constitute the 8-bit parallel data stream.

The serializer 312 successively converts the data in the words into serial data, and transmits to the data receiver 320. In the example shown in FIG. 9, bits in each of the words are arranged in the serial data SD and transmitted to the data receiver 320 in an order from the least significant bit (LSB) to the most significant bit (MSB) as indicated by the arrow toward the left direction.

The PRBS pattern shown in FIG. 9A is a cyclic pattern having 7 bits in a cycle, i.e., having a pattern length of 7 bits. In other words, as indicated by the arrow toward the left direction shown in FIG. 9A, the PRBS pattern in the serial data is a cyclic pattern that repeats a unit random pattern having a length of 7 bits.

For simplicity, bits of the 7-bit random data are represented by symbols a through g, each of which may have a value of 1 or 0. In the example shown in FIG. 9A, the least significant bit (LSB) of the 8-bit parallel data in the first row is represented by "a". The second bit of the same 8-bit parallel data is represented by "b". Similarly, the third through the seventh bits of the same 8-bit parallel data are represented by "c" through "g", respectively. And the most significant bit (MSB) of the same parallel data is represented by "a", which is the same as the least significant bit.

Next, the first through the sixth bits of the 8-bit parallel data in the second row are represented by "b" through "g". And the seventh and the eighth bits of the same parallel data are represented by "a" and "b", respectively. The eighth bit is the same as the first bit.

Further, the first through the fifth bits of the 8-bit parallel data in the third row are represented by "c" through "g". And the sixth through the eighth bits of the same parallel data are represented by "a" through "c".

As explained above, bits from LSB to MSB of 8-bit parallel data shown in FIG. 9A, which constitute the correct PRBS pattern, are represented by:

1st row: a, b, c, d, e, f, g, a;
2nd row: b, c, d, e, f, g, a, b; and
3rd row: c, d, e, f, g, a, b, c.

That is, the 8-bit parallel data is formed by shifting the 7-bit data represented by a, b, c, d, e, f, g, which is the unit of cycle of the PRBS pattern, toward the higher direction by one bit.

The serializer 312 of the data transmitter 310 converts the 8-bit parallel data shown in FIG. 9A into serial data SD, which has a cyclic pattern having 7 bits per cycle, and transmits the serial data SD to the data receiver 320. The de-serializer 321 of the data receiver 320 converts the serial data SD into 8-bit parallel data by acquiring the serial data SD at every 8 bits in synchronous with the clock signal.

When the timing of serial data SD shifts relative to the timing of clock signal CLK from the normal, starting positions of 8 bits of serial data acquired in synchronous with the clock signal may shift from the normal positions. As a result, a "bit-shift" occurs in the 8-bit parallel data stream as shown in FIG. 9B.

FIG. 9B shows an exemplary 8-bit parallel data stream converted by the de-serializer 321 in the data receiver 320 when the bit-shift occurs. In each word of the 8-bit parallel data shown in FIG. 9B, each bit shifts toward the upper direction by one bit compared with the correct 8-bit parallel data shown in FIG. 9A. Further, MSB of a word previously transmitted from the data transmitter 310 before the word shown in the first row of FIG. 9A, which cannot be acquired when the bit-shift does not occur, is acquired as LSB of the word shown in the first row of FIG. 9B.

That is, the bits from LSB to MSB of 8-bit parallel data shown in FIG. 9B are represented by:
1st row: g, a, b, c, d, e, f, g;
2nd row: a, b, c, d, e, f, g, a;
3rd row: b, c, d, e, f, g, a, b; and so on.

When the bit-shift occurs, the data receiver cannot correctly receive the data as shown in FIG. 9B. Nonetheless, the PRBS pattern generating circuit 322 in the data receiver 320 generates a reference pattern that matches the subsequently received data.

FIG. 9C shows 8-bit parallel data stream output from the PRBS generating circuit 322. The first row of FIG. 9C shows the 8-bit parallel data input from the de-serializer 321, which is the same as the 8-bit parallel data shown in the first row of FIG. 9B. The PRBS pattern generating circuit 322 generates a cyclic pattern using the bit sequence from the second to the eighth bits of the input parallel data as a unit of cycle. The second and the following rows of FIG. 9C show 8-bit parallel data stream generated by dividing the cyclic pattern at every 8 bits.

When, for example, the first 8-bit parallel data generated by the de-serializer 321 is represented by, from the LSB, g, a, b, c, d, e, f, g, the following 8-bit pattern generated by the PRBS pattern generating circuit 322 is represented by a, b, c, d, e, f, g, a, as shown in the second row of FIG. 9C. This pattern, which is used as the reference pattern in the comparing and checking circuit 323, matches the second 8-bit parallel data received by the data receiver 320 shown in the second row of FIG. 9B.

The PRBS pattern generating circuit 322 further generates, as shown in the third row of FIG. 9C, a PRBS pattern represented by b, c, d, e, f, g, a, b, which follows the reference PRBS pattern shown in the second row of FIG. 9C. This reference PRBS pattern matches the data b, c, d, e, f, g, a, b shown in the third row of FIG. 9B, which is received subsequent to the data shown in the second row. The situations are the same for the reference pattern and the data shown in the fourth and following rows in FIGS. 9B and 9C.

Accordingly, despite the fact that the data receiver cannot correctly receive the data due to the bit-shift, the reference pattern generated by the PRBS pattern generating circuit 322 continuously matches the received parallel data stream. As a result, it is difficult to detect incorrect receipt of the data due to the bit-shift in the parallel data stream.

Figure 1:
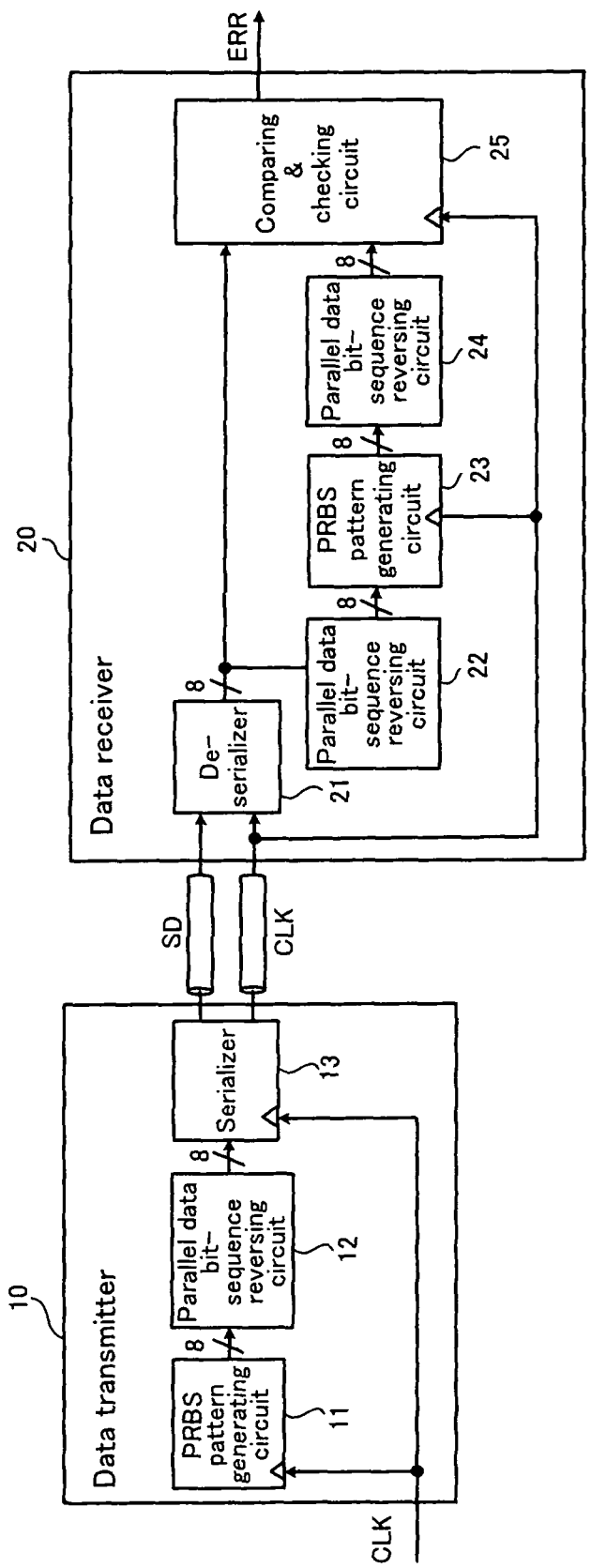
FIG. 1 is a schematic drawing that shows a construction of a first exemplary communication system.

FIG. 1 is a schematic drawing that shows an exemplary construction of a first communication system that can check whether the data transmitted from the data transmitter is correctly received by the data receiver.

The exemplary communication system 1 shown in FIG. 1 includes a data transmitter 10 that successively converts M-bit parallel data into serial data and transmits the converted serial data, and a data receiver 20 that successively receives the serial data. The exemplary communication system 1 has a function of testing whether the data transmitted from the data transmitter 10 is correctly received by the data receiver 20. Here, M is a positive integer larger than one, and may be 8, for example, in the exemplary communication system 1.

The data receiver 20 may be a product to be tested, and the data transmitter 10 may be a testing apparatus for testing the product. The relationship between the product and the testing apparatus may be reversed.

The data transmitter 10 includes a PRBS pattern generating circuit 11. The PRBS pattern generating circuit 11 generates a cyclic pattern that repeats an N-bit long predetermined bit-sequence as a unit of cycle. Here, N is an integer larger than one, and different from M. N may be 7, for example, in the exemplary pattern generating circuit 11. Specifically, the PRBS pattern generating circuit 11 generates the cyclic pattern based on the pseudo random binary sequence (PRBS).

FIG. 2 is a schematic drawing that shows an exemplary construction of the PRBS pattern generating circuit shown in FIG. 1.

The PRBS pattern generating circuit 11 includes a shift register constructed with three flip-flops 11_1A, 11_1B, and 11_1C, and an exclusive-OR gate 11_2. The PRBS pattern generating circuit 11 further includes a serial/parallel conversion unit 11_3. After inputting initial values into the shift register 11_1, the clock signal CLK is supply to generate a PRBS pattern.

Generally, a pattern length of a PRBS pattern generated by a PRBS pattern generating circuit is represented as $2^n-1$, where n is the number of stages of the shift register, which is three in the exemplary PRBS pattern generating circuit 11. Accordingly, the PRBS pattern generated by the PRBS pattern generating circuit 11 has a pattern length of $2^3-1=7$ bits. That is, the PRBS pattern repeats a predetermined bit sequence at every 7 bits. The predetermined bit sequence is determined by the initial values and the input-side connection of the exclusive-OR gate 11_2.

The shift register 11_1 outputs serial data SD having the PRBS pattern that repeats at every 7 bits, which is input to the serial/parallel conversion unit 11_3. This serial/parallel conversion unit 11_3 converts the input serial data SD into 8-bit parallel data PD by dividing the serial data SD at every 8 bits. Accordingly, the PRBS pattern generating circuit 11 outputs, from the serial/parallel conversion unit 11_3, 8-bit parallel data stream having the PRBS pattern such as shown in FIG. 9A.

The data transmitter 10 shown in FIG. 1 also includes a parallel data bit-sequence reversing circuit 12. The parallel data bit-sequence reversing circuit 12 reverses the sequence of bits in each word of the parallel data generated by dividing the PRBS pattern, which is a cyclic pattern generated by the PRBS pattern generating circuit 11, at every 8 bits. Specifically, the sequence of bits from MSB to LSB in each word of 8-bit parallel data is replaced with a reversed sequence of bits from LSB to MSB. Thereby, a bit-sequence reversed parallel data stream having a bit-sequence reversed pattern is generated with a plurality of bit-sequence reversed parallel data words.

FIG. 3 shows bit sequences of various signals in the communication system 1 shown in FIG. 1 when the bit-shift occurs.

FIG. 3A shows exemplary 8-bit parallel data stream having a correct PRBS pattern for testing. FIG. 3B shows exemplary bit-sequence reversed parallel data stream generated by the parallel data bit-sequence reversing circuit 12. The exemplary bit-sequence reversed parallel data stream having a correct bit-sequence reversed pattern is constituted by a plurality of bit-sequence reversed 8-bit parallel data words shown in respective rows of FIG. 3B. As shown in FIGS. 3A and 3B, the bit sequence from MSB to LSB of each of the 8-bit parallel data shown in FIG. 3A is replaced with a reversed bit-sequence from LSB to MSB of each of the 8-bit parallel data shown in FIG. 3B.

For example, the bit sequence of the first portion of the PRBS pattern shown in the first row of FIG. 3A is represented by, from LSB, a, b, c, d, e, f, g, a. This sequence is replaced with the bit sequence of the first portion of the bit-sequence reversed pattern shown in the first row of FIG. 3B represented by, from LSB, a, g, f, e, d, c, b, a. The bit sequence of the second portion of the PRBS pattern shown in the second row of FIG. 3A is represented by, from LSB, b, c, d, e, f, g, a, b. This sequence is replaced with the bit sequence of the second portion of the bit-sequence reversed pattern shown in the second row of FIG. 3B represented by, from LSB, b, a, g, f, e, d, c, b. The bit sequences of the third and following portions of the PRBS pattern shown in the third and following rows of FIG. 3A are also replaced with the corresponding portions of the bit-sequence reversed pattern shown in the third and following rows of FIG. 3B.

The data transmitter 10 shown in FIG. 1 includes a serializeer 13. The serializer 13 converts the bit-sequence reversed pattern generated by the parallel data bit-sequence reversing circuit 12 into serial data SD. Then, the data transmitter 10 transmits the converted serial data SD together with a clock signal CLK. The clock signal CLK is used for acquiring the 8-bit parallel data that constitute the bit-sequence reversed pattern.

The data receiver 20 includes a de-serializer 21, a first parallel data bit-sequence reversing circuit 22, a PRBS pattern generating circuit 23, a second parallel data bit-sequence reversing circuit 24, and a comparing and checking circuit 25.

The de-serializer 21 receives and acquires the serial data SD transmitted from the data transmitter 10 in synchronous with the clock signal CLK and converts the acquired serial data SD into 8-bit parallel data stream.

The first parallel data bit-sequence reversing circuit 22 receives the parallel data stream from the de-serializer 21 and performs a process opposite to the process performed by the parallel data bit-sequence reversing circuit 12 in the data transmitter 10. Thereby, the first parallel data bit-sequence reversing circuit 22 attempts to restore the original pattern before reversing the bit-sequences by the parallel data bit-sequence reversing circuit 12.

Specifically, the first parallel data bit-sequence reversing circuit 22 replaces the sequence of 8 bits in each of the 8-bit parallel data from MSB to LSB with a reversed sequence from LSB to MSB. The bit-sequence reversed parallel data generated by the first parallel data bit-sequence reversing circuit 22 is input to the PRBS pattern generating circuit 23.

The PRBS pattern generating circuit 23 has a construction same as the construction of the PRBS pattern generating circuit 11 in the data transmitter 10 shown in FIG. 2. For example, the PRBS pattern generating circuit 23 may include a shift register with a number of stages same as the shift register included in the PRBS pattern generating circuit 11 of the data transmitter 10. The PRBS pattern generating circuit 23 may further include an exclusive-OR gate having the same connection as the exclusive-OR gate included in the PRBS pattern generating circuit 11.

The PRBS pattern generating circuit 23 starts to generate, when the first 8-bit parallel data is input from the first parallel data bit-sequence reversing circuit 22, a PRBS pattern using the input data as initial values. Specifically, the PRBS pattern generating circuit 23 inputs the last three bits of the input data in the shift register, and starts generating a cyclic PRBS pattern that follows the bit sequence of the input data. Further, the PRBS pattern generating circuit 23 divides the PRBS pattern at every 8 bits and generates 8-bit parallel data stream.

The second parallel data bit-sequence reversing circuit 24 processes the cyclic pattern generated by the PRBS pattern generating circuit 23 in the same way as the parallel data bit-sequence reversing circuit 12 processes the PRBS pattern generated by the PRBS pattern generating circuit 11 in the data transmitter 10. Thereby, the second parallel data bit-sequence reversing circuit generates a bit-sequence reversed reference pattern.

The comparing and checking circuit 25 compares the parallel data stream supplied from the de-serializer 21 and the bit-sequence reversed reference pattern generated by the second parallel data bit-sequence reversing circuit 24, and checks if the serial data SD is correctly received. When it is detected that the serial data SD is not received correctly, the comparing and checking circuit 25 outputs a bit-error detection signal ERR.

As explained above, FIG. 3A shows an exemplary parallel data stream generated by the PRBS pattern generating circuit 11. FIG. 3B shows correct bit-sequence reversed parallel data stream generated in the parallel data bit-sequence reversing circuit 12 by reversing the bit-sequence of the exemplary parallel data stream shown in FIG. 3A.

When the timing of serial data SD shifts relative to the timing of clock signal CLK due to, for example, a delay in the de-serializer 21 included in the data receiver 20, the data receiver 20 cannot correctly acquire the serial data SD. As a result, the de-serializer 21 outputs a parallel data stream different from the parallel data stream shown in FIG. 3B. In other words, a bit-shift occurs in the parallel data stream output from the de-serializer 21. FIG. 3C shows an exemplary parallel data stream output from the de-serializer 21 when the bit-shit occurs.

The bits from the LSB of exemplary 8-bit parallel data stream shown in FIG. 3C, which are shifted from the bits shown in FIG. 3B, are represented by:
1st row: g, a, g, f, e, d, c, b;
2nd row: a, b, a, g, f, e, d, c;
3rd row: b, c, b, a, g, f, e,
4th row: c, d, c, b, a, g, f, e;
5th row: d, e, d, c, b, a, g, f; and so on.

That is, compared with the correct parallel data stream shown in FIG. 3B, each bit in each word of the parallel data shifts toward the upper direction by one bit, and LSB of each word is replaced with MSB of the previous word. Accordingly, as shown in FIG. 3D, after reversing the bit-sequence in the first parallel data bit-sequence reversing circuit 22, the bits from the LSB are represented by:
1st row: b, c, d, e, f, g, a, g;
2nd row: c, d, e, f, g, a, b, a;
3rd row: d, e, f, g, a, b, c, b;
4th row: e, f, g, a, b, c, d, c;
5th row: f, g, a, b, c, d, e, d; and so on.

The PRBS pattern generation circuit 23 receives the first 8-bit data represented by b, c, d, e, f, g, a, g, and generates a cyclic pattern following the received data. As a result, the bit sequence of the cyclic pattern generated by the PRBS pattern generating circuit 23 does not match the bit sequence of the original cyclic pattern shown in FIG. 3A.

As explained above, the pattern length of the PRBS pattern generated by the exemplary PRBS pattern generating circuit 11 having three-stage shift register shown in FIG. 2 is $2^3-1=7$ bits. In the data transmitter 10, the parallel data bit-sequence reversing circuit 12 replaces the bit sequence from MSB to LSB in each of the 8-bit parallel data, which is generated by dividing the PRBS pattern at every 8 bits, with a reversed bit sequence from LSB to MSB, as shown in the FIG. 3B. The pattern length of the serial data output from the bit-sequence reversed 8-bit parallel data is $(2^3-1)\times 8=56$ bits.

When no bit-shift occurs, the first parallel data bit-sequence reversing circuit 22 in the data receiver 20 can correctly restore the original PRBS pattern generated by the PRBS pattern generating circuit 11 in the data transmitter 10. The PRBS pattern generating circuit 23 in the data receiver 20 receives the first 8 bits of the correctly restored PRBS pattern and generates a PRBS pattern that follows the received bits by using the last 3 bits of the received bits as initial values. Accordingly, the PRBS pattern generating circuit 23 in the data receiver 20 generates the same PRBS pattern generated by the PRBS pattern generating circuit 11 in the data transmitter 10.

The PRBS pattern generating circuit 23 divides the generated PRBS pattern at every 8 bits and generates 8-bit parallel data stream. Further, the second parallel data bit-sequence reversing circuit 24 reverses the bit sequence of each of the 8-bit parallel data in the 8-bit parallel data stream. Accordingly, the second parallel data bit-sequence reversing circuit 24 generates a pattern that matches the pattern of the 8-bit parallel data stream output from the de-serializer 21. As a result, the comparing and checking circuit 25 determines that no bit-shift occurs.

When the bit-shift occurs, on the other hand, reversing the bit-sequence of each of the 8-bit parallel data in the first parallel data bit-sequence reversing circuit 22 cannot restore the original PRBS pattern generated by the PRBS pattern generating circuit 11 in the data transmitter 10. Rather, the first parallel data bit-sequence reversing circuit 22 generates a pattern having a pattern length different from the pattern length of the original PRBS pattern. In the exemplary bit-sequence reversed pattern shown in FIG. 3D, the pattern length is 56 bits.

When the first 8 bits of the bit-sequence reversed pattern generated by the first parallel data bit-sequence reversing circuit 22 are input, the PRBS pattern generating circuit 23 generates a PRBS pattern having a pattern length of 7 bits by using the last 3 bits of the input bits as initial values. The pattern generated by the PRBS pattern generating circuit 23 does not match the pattern generated by the first parallel data bit-sequence reversing circuit 22, because the pattern lengths thereof are different.

Accordingly, reversing the bit sequence of each of the 8-bit parallel data in the parallel data stream supplied from the PRBS pattern generating circuit 23 does not generate a pattern that matches the pattern output from the de-serializer 21. As a result, the comparing and checking circuit 25 detects that the bit-shift occurs.

As explained above, in the data transmitter 10 of the first exemplary communication system 1, the PRBS pattern generating circuit 11 generates a cyclic pattern that repeats 7-bit long predetermined pattern as a unit of cycle. The PRBS pattern generating circuit further generates parallel data stream constituted by a plurality of parallel data words generated by dividing the cyclic pattern at every 8 bits. The parallel data bit-sequence reversing circuit 12 reverses the bit sequence, i.e., replaces the bit sequence from MSB to LSB of each word of the parallel data with a reversed bit sequence from LSB to MSB. Thereby, the parallel data bit-sequence reversing circuit 12 generates a bit-sequence altered parallel data stream having a bit-sequence altered pattern with a plurality of bit-sequence altered parallel data words. The data transmitter 10 further converts the bit-sequence altered parallel data stream into serial data SD, and transmits the serial data SD to the data receiver 20 together with the clock signal SD.

In the data receiver 20, the de-serializer 21 converts the received serial data SD into 8-bit parallel data stream. The first parallel data bit-sequence reversing circuit 22 performs a process that is opposite to the process performed by the parallel data bit-sequence reversing circuit 12 in the data transmitter 10 to the converted 8-bit parallel data stream. Thereby, the first parallel data bit-sequence reversing circuit 22 attempts to restore the original pattern before reversing the bit sequence in the parallel data bit-sequence reversing circuit 12 of the transmitter 10.

The PRBS pattern generating circuit 23 has the same construction as the PRBS pattern generating circuit 11 of the data transmitter 10. The PRBS pattern generating circuit 23 generates a PRBS pattern that follows the first 8 bits of the pattern processed by the first parallel data bit-sequence reversing circuit 22. The second parallel data bit-sequence reversing circuit 24 performs the same process performed by the parallel data bit-sequence reversing circuit 12 in the data transmitter 10 to generate the bit-sequence altered reference pattern. Further, the comparing and checking circuit 25 compares the parallel data stream from the de-serializer 21 with the bit-sequence altered reference pattern.

When the bit-shift occurs due to, for example, a shift of the timing of serial data SD relative to the timing of clock signal CLK, the reference pattern does not match the parallel data stream. Accordingly, the first exemplary communication system 1 shown in FIG. 1 can detect the bit-shift. As a result, it becomes possible to test whether the data transmitted from the data transmitter is correctly received by the data receiver.

Figure 4:
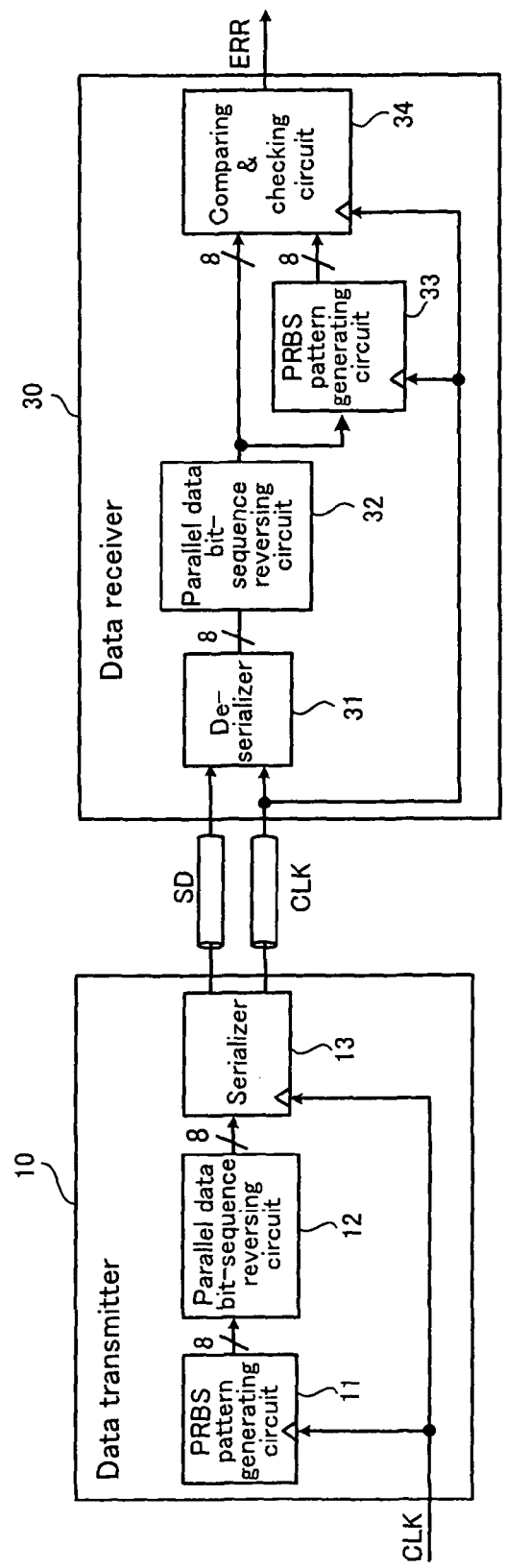
FIG. 4 is a schematic drawing that shows a construction of second exemplary communication system.
Figure 5:
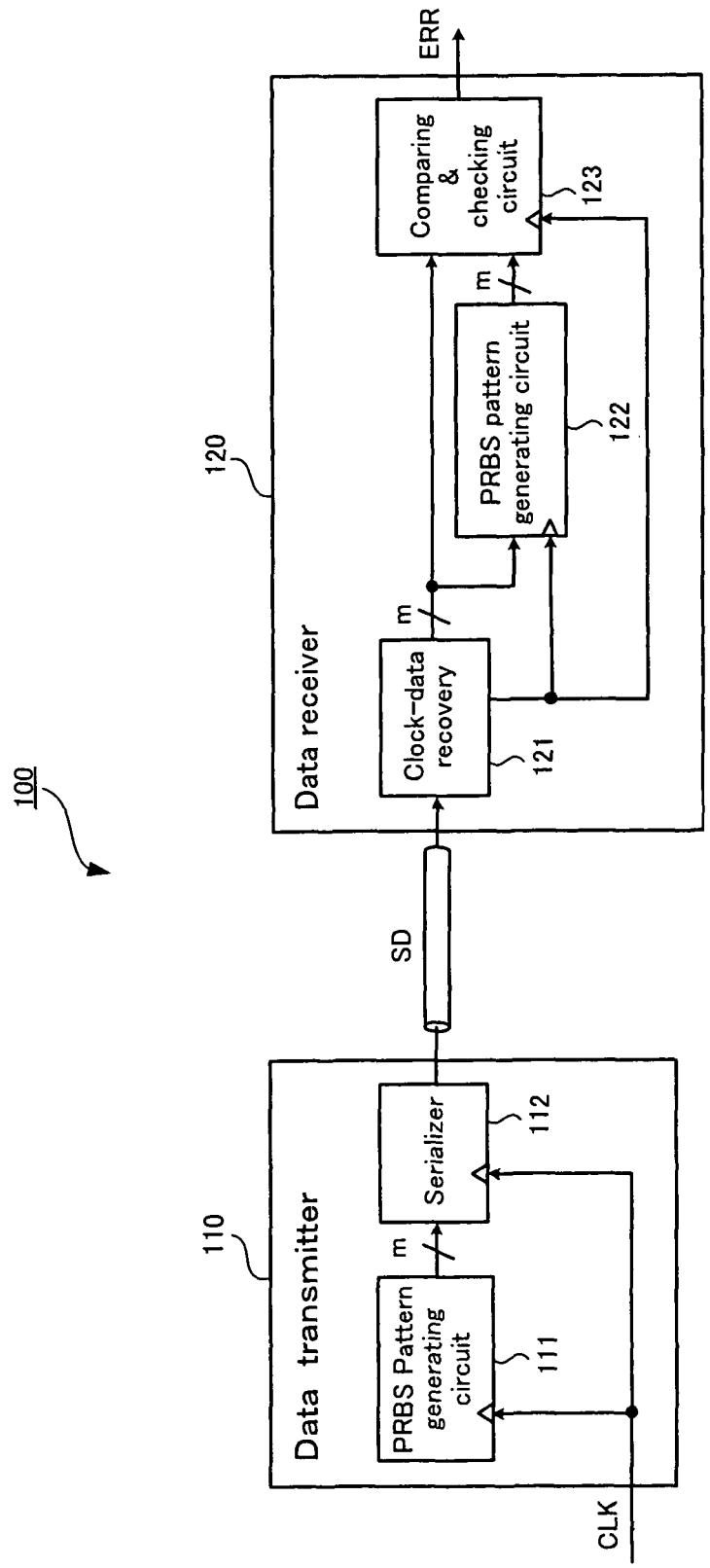
FIG. 5 is a schematic drawing that shows a construction of a conventional communication system capable of performing a test using PRBS pattern.
Figure 6:
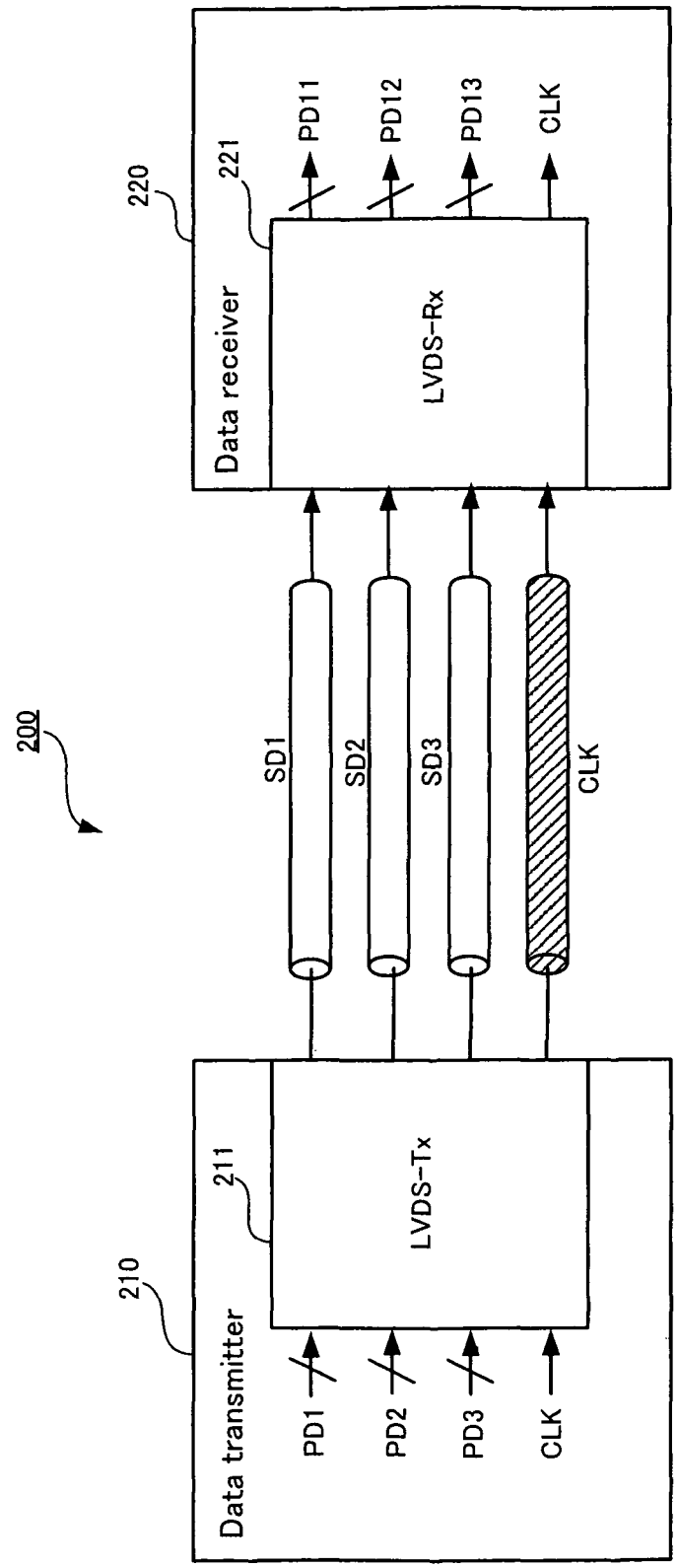
FIG. 6 is a schematic drawing that shows an exemplary communication system that utilizes the second communication scheme.
Figure 7:
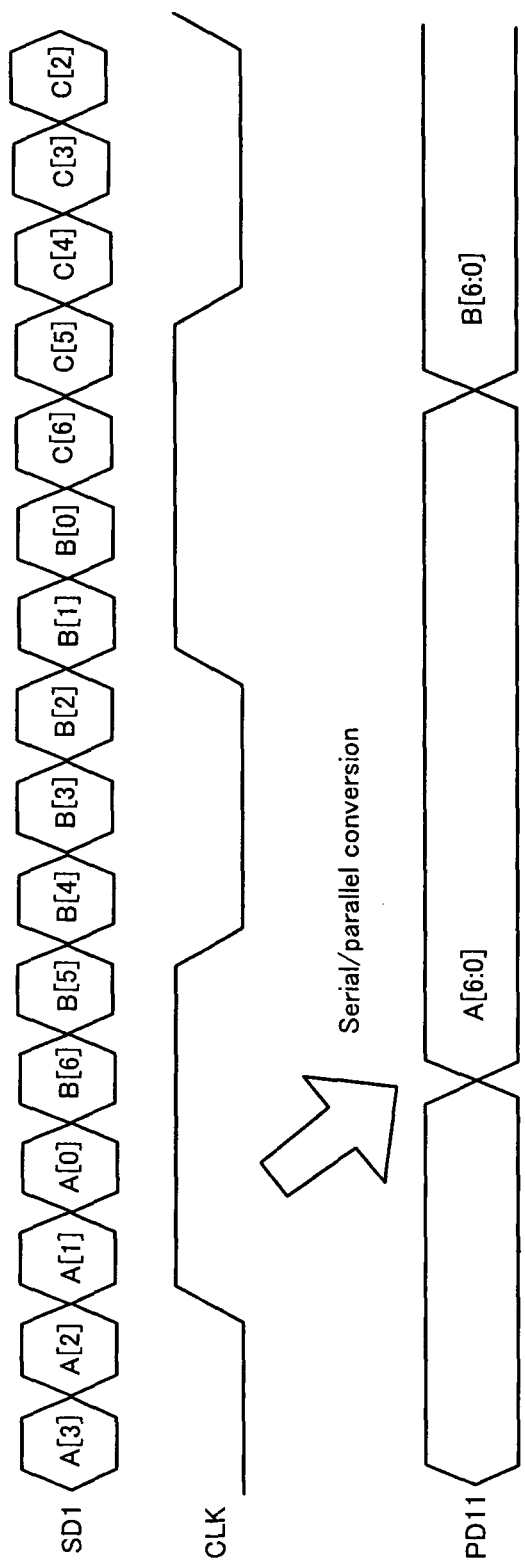
FIG. 7 is a timing chart showing an exemplary timing relationship between the serial data received by the data receiver shown in FIG. 6 and the clock signal.

FIG. 4 is a schematic drawing that shows a construction of a second exemplary communication system. In FIG. 4, same components included in the first exemplary communication system shown in FIG. 1 are supplied with the same reference numerals.

In the second exemplary communication system shown in FIG. 4, the data receiver 20 included in the first exemplary data communication system shown in FIG. 1 is replaced with a second data receiver 30. The second data receiver 30 includes a de-serializer 31, a parallel data bit-sequence reversing circuit 32, a PRBS pattern generation circuit 33, and a comparing and checking circuit 34.

The de-serializer 31 acquires the serial data SD transmitted from the data transmitter 10 in synchronous with the clock signal CLK and converts the acquired serial data into 8-bit parallel data stream.

The parallel data bit-sequence reversing circuit 32 performs a process that is opposite to the process performed by the parallel data bit-sequence reversing circuit 12 in the data transmitter 10. That is, the parallel data bit-sequence reversing circuit 32 reverses the bit sequence in each of the parallel data converted by the de-serializer 31, and generates bit-sequence reversed parallel data stream. The generated bit-sequence reversed parallel data stream is input to the PRBS pattern generating circuit 33 and to the comparing and checking circuit 34.

The PRBS pattern generating circuit 33 generates a reference PRBS pattern. Specifically, when the first 8-bit parallel data is input from the parallel data bit-sequence reversing circuit 32, the PRBS pattern generating circuit 33 generates a cyclic PRBS pattern that follows the input data.

The PRBS pattern generating circuit 33 may have a construction sane as the PRBS pattern generating circuit 11 in the data transmitter 10 shown FIG. 2. That is, the PRBS pattern generating circuit 33 may include a shift register having the same number of stages as the shift register 11_1 in the PRBS pattern generating circuit 11. The PRBS pattern generating circuit 33 may further include an exclusive-OR gate having the same connection as the exclusive-OR gate included in the PRBS pattern generating circuit 11. The PRBS pattern generating circuit 23 inputs the last three bits of the input data in the shift register as initial values, and starts generating a cyclic PRBS pattern that follows the bit sequence of the input data.

Comparing and checking circuit 34 compares the parallel data stream supplied from the parallel data bit-sequence reversing circuit 32 and the reference PRBS pattern generated by the PRBS pattern generating circuit 33, and checks if the receiver 30 correctly receives the data. When it is detected that the receiver 30 does not correctly receive the data, the comparing and checking circuit outputs bit-error detection signal ERR.

As explained above, the pattern length of the serial data SD transmitted from the data transmitter is 56 bits.

When no bit-shift occurs, the parallel data bit-sequence reversing circuit 32 in the data receiver 30 correctly restores the original PRBS pattern generated by the PRBS pattern generating circuit 11 in the data transmitter 10. The PRBS pattern generating circuit 33 in the data receiver 20 receives the first 8 bits of the restored PRBS pattern and generates a PRBS pattern that follows the received data.

Accordingly, the PRBS pattern generating circuit 33 in the data receiver 30 generates the same PRBS pattern generated by the PRBS pattern generating circuit 11 in the data transmitter 10. As a result, the comparing and checking circuit 34 determines that no bit-shift occurs.

When the bit-shift occurs, on the other hand, reversing the bit sequence of each of the 8-bit parallel data in the parallel data bit-sequence reversing circuit 32 does not restore the original PRBS pattern generated by the PRBS pattern generating circuit 11 in the data transmitter 10. Rather, the parallel data bit-sequence reversing circuit 32 generates a pattern having a pattern length different from the pattern length of the original PRBS pattern.

Nonetheless, the PRBS pattern generating circuit 33 generates a PRBS pattern having a pattern length of 7 bits following the data input from the parallel data bit-sequence reversing circuit 32. The pattern generated by the PRBS pattern generating circuit 33 does not match the pattern generated by the parallel data bit-sequence reversing circuit 32, because the pattern lengths thereof are different. As a result, the comparing and checking circuit 34 detects that the bit-shift occurs.

According to the second exemplary communication system 2, the data transmitter 10 operates similarly to the data transmitter 10 in the first exemplary data communication system 1. That is, the data transmitter 10 generates bit-sequence altered pattern, converts the generated pattern into serial data SD, and transmits the serial data SD together with the clock signal CLK.

In the data receiver 30 according to the second exemplary communication system 2, the de-serializer 31 receives the serial data SD and converts the received serial data into parallel data stream. The parallel data bit-sequence reversing circuit 32 reverses the bit sequence of each of the parallel data to generate bit-sequence reversed parallel data stream. Thereby, the parallel data bit-sequence reversing circuit 32 attempts to restore the original pattern before the bit-sequence reversal in the data transmitter.

The PRBS pattern generating circuit 33 may have the same construction as the PRBS pattern generating circuit 11 in the data transmitter 10. The PRBS pattern generating circuit generates a cyclic pattern that follows the initial values input from the parallel data bit-sequence reversing circuit 32, which is used as a reference pattern. The comparing and checking circuit 34 compares the bit-sequence reversed parallel data stream and the cyclic pattern generated by the PRBS pattern generating circuit.

Accordingly, the bit-shift in the received parallel data, which is occurred due to, for example, a shift of the timing of serial data SD relative to the timing of clock signal CLK, can be detected, because the reference pattern does not match the pattern of the parallel data stream that includes the bit-shift. As a result, it is possible to test if the data receiver 30 correctly receives the data transmitted from the data transmitter 10.

In the various exemplary embodiments, a PRBS pattern, which is a cyclic pattern with pseudo-random binary sequence, is used as the cyclic pattern. However, various other types of cyclic patterns may be used as long as the number of bits N included in the unit of cycle is different from the width M of the parallel data.

In the various exemplary embodiments, the PRBS pattern generating circuit in the data receiver receives the bits in the first word of the parallel data stream after the attempt of restoring the original pattern, or a "bit-sequence restored parallel data stream", and generates a reference cyclic pattern by using the received bits as initial values. Specifically, an exemplary PRBS pattern generating circuit, which is constructed with a 3-stage shift register, generates a reference cyclic pattern by using the last 3 bits of the received bits as initial values. However, the PRBS pattern generating circuit may generates, by using arbitrary consecutive 3 bits of the bit-sequence restored parallel data stream as initial values, a reference cyclic pattern that follows the bits used as initial values.

In general, the data receiver may include a various types of cyclic pattern generating circuits that require a various number of bits as initial values. The cyclic pattern generating circuit may receive a portion, which includes the required number of bits, of the bit-sequence restored parallel data stream and generate the reference cyclic pattern by using the bits in the received portion of the bit-sequence restored parallel data stream as initial values. Thereby, the cyclic pattern generating circuit may generate the reference cyclic pattern that follows the bits used as initial values.

In the various exemplary embodiments, sequence of 8 bits from MSB to LSB in each of the words of the parallel data is reversed. In other words, the bit sequence from MSB to LSB in each word is replaced with a reversed bit sequence from LSB to MSB. Thereby, the bit-sequence altered parallel data stream having a bit-sequence altered pattern is generated with a plurality of bit-sequence altered words. However, the bit-sequence altered parallel data stream having a bit-sequence altered pattern may be generated by various other ways as long as the bit-sequence altered pattern has a pattern length different from the pattern length N of original cyclic pattern.

For example, at least two specified ones of the bits in each M bit parallel data may be replaced with each other. Preferably, at least one of MSB and LSB in each M bit parallel data may be replaced with another specified one of the bits within the same parallel data. Further preferable, MSB and LSB in each of M bit parallel data may be replaced with each other.

In the various exemplary embodiments, the data receiver may be a product to be tested and the data transmitter may be an apparatus for testing the product. The relationship between the product and the apparatus for testing may be reversed. The timing of serial data SD transmitted from the data transmitter 10 may shift relative to the timing of clock signal CLK due to, for example, a delay in the serializer 13 in the data transmitted 10. As a result, the data receiver 20 or 30 cannot correctly acquire the serial data SD. The data receiver 20 or 30 can check if the data receiver correctly receives the data transmitted from the data transmitter 10.

What is claimed is:

1. A communication system comprising:
   a data transmitter including:
      a transmitter cyclic pattern generating circuit that generates a transmitter cyclic pattern having a pattern length of N bits and converts the transmitter cyclic pattern into a M-bit transmitter parallel data stream, where each of N and M is an integer larger than one and N and M are different with each other;
      a transmitter bit-sequence altering circuit that alters a sequence of bits in each word of the transmitter parallel data stream by performing a transmitter altering process including replacing specified ones of the bits in each word of the transmitter parallel data stream with each other so that a bit-sequence altered transmitter parallel data stream is generated; and
      a serializer that converts the bit-sequence altered transmitter parallel data stream into a serial data in synchronous with a clock signal and transmits the serial data together with the clock signal; and
   a data receiver including:
      a de-serializer that receives the serial data and the clock signal, and converts the serial data into a M-bit receiver parallel data stream in synchronous with the clock signal;
      a receiver bit-sequence altering circuit that alters a sequence of bits in each word of the receiver parallel data stream by performing a receiver altering process opposite to the transmitter altering process so that a bit-sequence restored parallel data stream is generated;
      a receiver cyclic pattern generating circuit having the same construction as the transmitter cyclic pattern generating circuit, the receiver cyclic pattern generating circuit generates a reference cyclic pattern by using bits in the bit-sequence restored parallel data stream as initial values and converts the reference cyclic pattern into a M-bit reference parallel data stream; and
      a comparing and checking circuit that compares one of (i) the receiver parallel data stream with a bit-sequence altered reference parallel data stream, and (ii) the bit-sequence restored parallel data stream with the reference parallel data stream, and generates a bit-error detection signal when the serial data is not received correctly, wherein
         when the comparing and checking circuit compares the receiver parallel data stream with the bit-sequence altered reference parallel data stream, the data receiver further includes a second bit-sequence altering circuit that alters a sequence of bits in each word of the reference parallel data stream by performing a second altering process same as the transmitter altering process so that the bit-sequence altered reference parallel data stream is generated.

2. The system according to claim 1, wherein the receiver cyclic pattern generating circuit generates the reference cyclic pattern by using bits in a first word of the bit-sequence restored parallel data stream.

3. The system according to claim 1, wherein the serial data has a cyclic pattern having an altered pattern length different from N bits.

4. The system according to claim 1, wherein the serial data has a cyclic pattern having an altered pattern length of N×M bits.

5. The system according to claim 1, wherein the specified ones of the bits include at least one of a most significant bit and a least significant bit.

6. The system according to claim 1, wherein the transmitter altering process includes reversing the bit sequence from a most significant bit to a least significant bit in each word.

7. A data receiver comprising:
   a de-serializer that receives a serial data and a clock signal and converts the serial data into a M-bit receiver parallel data stream in synchronous with the clock signal;
   a receiver bit-sequence altering circuit that alters a sequence of bits in each word of the receiver parallel data stream by performing a first altering process including replacing specified ones of the bits in each word of the receiver parallel data stream with each other so that a bit-sequence restored parallel data stream is generated;
   a receiver cyclic pattern, generating circuit that generates a reference cyclic pattern having a pattern length of N bits by using bits in the bit-sequence restored parallel data stream as initial values, where each of N and M is an integer larger than one and N and M are different with each other, the receiver cyclic pattern generating circuit further converts the reference cyclic pattern into a M-bit reference parallel data stream; and
   a comparing and checking circuit that compares one of (i) the receiver parallel data stream with a bit-sequence altered reference parallel data stream, and (ii) the bit-sequence restored parallel data stream with the reference parallel data stream, and generates a bit-error detection signal when the serial data is not received correctly, wherein
      when the comparing and checking circuit compares the receiver parallel data stream with the bit-sequence altered reference parallel data stream, the data receiver further includes a second bit-sequence altering circuit that alters a sequence of bits in each word of the reference parallel data stream by performing a second altering process opposite to the first altering process so that the bit-sequence altered reference parallel data stream is generated.

8. The data receiver according to claim 7, wherein the receiver cyclic pattern generating circuit generates the reference cyclic pattern by using bits in a first word of the bit-sequence restored parallel data stream.

9. The data receiver according to claim 7, wherein the serial data has a cyclic pattern having an altered pattern length different from N bits.

10. The data receiver according to claim 7, wherein the serial data has a cyclic pattern having an altered pattern length of N×M bits.

11. The data receiver according to claim 7, wherein the specified ones of the bits include at least one of a most significant bit and a least significant bit.

12. The data receiver according to claim 7, wherein the first altering process includes reversing the bit sequence from a most significant bit to a least significant bit.

* * * * *